(12) United States Patent
Morimoto

(10) Patent No.: US 6,426,238 B1
(45) Date of Patent: Jul. 30, 2002

(54) CHARGE TRANSFER DEVICE AND SOLID IMAGE PICKUP APPARATUS USING THE SAME

(75) Inventor: Michihiro Morimoto, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/839,068

(22) Filed: Apr. 20, 2001

(30) Foreign Application Priority Data

Apr. 21, 2000 (JP) ........................................ 2000-121026

(51) Int. Cl.$^7$ ............................................. H01L 21/00
(52) U.S. Cl. ..................... 438/52; 438/396; 438/734; 438/735; 365/183; 357/24; 257/221; 257/239
(58) Field of Search .......................... 438/52, 396, 734, 438/735; 257/221, 239; 357/24; 365/183

(56) References Cited

U.S. PATENT DOCUMENTS

| 4,131,950 A | * | 12/1978 | Van Santen | 365/183 |
| 4,262,297 A | * | 4/1981 | Partridge | 357/24 |
| 4,814,843 A | * | 3/1989 | Nishizawa | 357/24 |
| 5,227,650 A | * | 7/1993 | Noguchi et al. | 257/239 |
| 5,286,987 A | * | 2/1994 | Watanabe | 257/221 |

FOREIGN PATENT DOCUMENTS

| JP | 4-273449 | 9/1992 | ......... H01L/21/339 |
| JP | 5-55539 | 3/1993 | ......... H01L/27/148 |
| JP | 9-252106 | 9/1997 | ......... H01L/27/148 |
| JP | 11-17163 | 1/1999 | ......... H01L/29/762 |
| JP | 11-40800 | 2/1999 | ......... H01L/29/762 |
| JP | 2000-40814 | 2/2000 | ......... H01L/27/148 |

* cited by examiner

Primary Examiner—Richard Elms
Assistant Examiner—Pho Luu
(74) Attorney, Agent, or Firm—Hayes Soloway P.C.

(57) ABSTRACT

A charge transfer device is provided, capable of preventing degradation of the charge transfer efficiency when the channel width becomes narrower due to the narrow channel effect. The charge transfer device of the present invention is obtained by forming a charge transfer electric field in a channel below a boundary portion between a terminal storage electrode and a terminal barrier electrode, which constitute a pair of charge transfer electrodes located closest to the output electrode, to be higher than a charge transfer electric field in a channel below a boundary portions of pairs of storage electrodes and barrier electrodes, which constitute pairs of storage electrodes and barrier electrodes other than the pair of the terminal electrodes.

8 Claims, 10 Drawing Sheets

CHARGE TRANSFER DEVICE AND SOLID IMAGE PICKUP APPARATUS USING THE SAME

BACKGROUND OF THE INVENTION

1. Field of the Invention

The present inventions relates to a CCD (Charge Coupled Device)-type charge transfer device driven by two phase pulses and to a solid image pickup apparatus using such charge transfer devices, and in particular, relates to an improvement for increasing the charge transfer efficiency adjacent to an output portion of the charge transfer device.

2. Description of the Related Art

FIG. 6 is a diagram showing the structure of a general interline transfer-type solid image pickup apparatus. In FIG. 6, reference numeral 101 denotes a photodiode, 102 denotes a vertical CCD register which receives and transfers a charge from the photodiode 101, 103 denotes a horizontal CCD register which receives and transfers the charge from the vertical CCD register 102, 104 denotes a charge detection portion which detects the charge transferred from the horizontal CCD register 103, and 105 denotes an output amplifier. Here, a rectangular portion enclosed by a broken line shows a pixel 106.

For an image pickup apparatus used for a digital still camera such as a digital steal camera, reduction of the power consumption is indispensable. In the case of a two dimensional CCD image sensor, the power consumption of the horizontal CCD registers is particularly large, and the power consumption increases as the speed of the horizontal CCD registers increases. In order to reduce the power consumption, the reduction of the driving voltage of the horizontal CCD register is an critical problem to be solved.

One of the measures to solve the above-described problem is disclosed in Japanese Unexamined Patent Application, First Publication No. 11-17163. This disclosure involves a method in which, in a CCD-type register having two layered electrodes and a two phase driving system, generation of the potential drop under the boundary between two electrodes is suppressed by forming an n-type low concentration semiconductor layer in a self-aligning manner.

FIG. 7 is a plan view showing the structure of the output portion of the conventional horizontal CCD registers, and FIG. 8 shows a cross-sectional view along the line II—II. As shown in FIG. 7, above the charge transfer channel 111, a plurality of storage electrodes 112a, 112b, 112c, . . . and a plurality of barrier electrodes 113a, 113b, 113c, . . . are formed. Here, to simplify the description, a pair of charge transfer electrodes composed of a storage electrode 112a and a barrier electrode 113a, disposed at the most left side of FIG. 7, is called horizontal terminal electrodes and the other pairs of charge transfer electrodes are simply called horizontal electrodes.

An output electrode 114 is disposed adjacent to the horizontal terminal storage electrode 112a. At one terminal of the output gate electrode 114, a floating diffusion layer 115, which constitutes a charge detection portion 104, is formed, and the floating diffusion layer 115 is connected to the output amplifier 105. At one side of the floating diffusion layer 115, a reset gate electrode 116 is provided, and at one side of the reset gate electrode 116, a reset drain 117 is provided. Each adjoining pair of storage electrodes 112a, 112b, 112c, . . . , and barrier electrodes 113a, 113b, 113c, . . . are connected to one metal wire 118 and the other metal wire 119 alternatively.

Two phase driving pulses φH1 and φH2 are respectively input into one metal wire 118 and the other metal wire 119. A direct-current (dc) voltage VOG is applied to the output gate 114, a reset pulse φR is input into the reset gate electrode 116, and a dc voltage VRG is applied to the reset drain 117.

Next, the cross-sectional structure shown in FIG. 8 is explained in the order of the manufacturing process. FIG. 9 shows a manufacturing method of the conventional charge transfer device. As shown in FIG. 9A, an $n^-$-type semiconductor well 121 having an impurity concentration of $8\times10^{16}$ $cm^{-3}$ is formed with a thickness of 0.5 μm on a p-type silicon substrate 120 having an impurity concentration of $1\times10^{15}$ $cm^{-3}$, and a first insulating film 122 is formed with a thickness of 100 nm on the surface of the $n^-$-type semiconductor well 121 by an oxidation process such as thermal oxidization. Subsequently, as shown in FIG. 9B, a first polycrystalline silicon film is deposited with a thickness of 300 nm and the barrier electrodes 113a, 113b, 113c, . . . and the output gate electrode 114 and reset gate electrode 116 are formed by patterning the first polycrystalline silicon film.

Subsequently, as shown in FIG. 9C, an approximately 100 nm thick second insulating film 123 is formed on the $n^-$-type semiconductor well 121 by an oxidation process such as thermal oxidization, and a third insulating film 124 is formed on the side surfaces of the barrier electrodes 113a, 113b, 113c, . . . , the output gate electrode 114, and the reset gate electrode 116 by an accelerating oxidation of the polycrystalline silicon. Subsequently, a resist film is coated thereon, a resist pattern 125 is formed by photolithography, and $n^-$-type semiconductor regions 126a, 126b, 126c, . . . are formed by phosphorus ion implantation. Here, the first polycrystalline silicon layer and the third insulating layer serve as the mask for the ion implantation.

Subsequently, as shown in FIG. 9D, a 300 nm thick second polycrystalline silicon film is deposited and a plurality of charge electrodes 112a, 112b, 112c, . . . are formed by patterning the film using photolithography. Subsequently, as shown in FIG. 9E, an $n^+$-type semiconductor region 127 having an impurity concentration of $1\times10^{20}$ $cm^{-3}$ is formed with a thickness of 0.3 μm and then an interlayer insulating film 128 is formed. Subsequently, as shown in FIG. 9F, a through hole (not shown) is formed, an aluminum film (not shown) is deposited, and by patterning the aluminum film using photolithography, two metal conducive lines 118 and 119 are formed. The first polycrystalline silicon film, the second polycrystalline silicon, and $n^+$-type semiconductor region 127 are respectively connected to those lines. The charge transfer device is obtained by the above-described manufacturing process, and the structure shown in FIG. 9F becomes the same as that shown in FIG. 8

As shown in FIG. 7, although the channel widths W1 of general CCD registers are 10 to 50 μm, the channel width W2 in the vicinity of the horizontal terminal electrode is formed as narrow as 5 to 10 μm. The reason for this narrow channel width is that it is necessary to minimize the area of the floating diffusion layer in order to increase the charge detecting sensitivity of the charge detection portion 104. In general when the channel width is formed narrower in the charge transfer direction, the transfer electric field decreases and the charge transfer efficiency decreases as the channel width becomes narrower.

FIG. 10 is a typical diagram showing a schematic potential distribution in the vicinity of the output portion of the conventional horizontal CCD register. This figure illustrates a case of charge transfer by two phase driving pulses φH1 and φH2. The signal charge is transferred from the right side to the left side of the figure. The bold solid lines A indicate the state in which the φH1 is at a low level, φH2 is at a high level, and φR is at a low level. In contrast, the thin line B in the figure indicates the state in which the φH1 is at a high level, φH2 is at a low level, and φR is at a high level; thus, the signal charge stored in the floating diffusion layer 115 is discharged through the reset gate electrode 116 to the reset drain 117. Simultaneously, the signal charge for the next bit stored in the previous stage is transferred to the horizontal terminal electrode portion.

The variation of the channel potential due to the horizontal driving pulse is equivalent to a sum of $\Delta V1$ and $\Delta V2$, shown in FIG. 10. The $\Delta V1$ represents the channel potential difference between the lower side of the storage electrodes 112$b$, 112$c$, 112$d$, . . . and the lower side of the barrier electrodes 113$b$, 113$c$, 113$d$, . . . when the same pulse is input. In contrast, the $\Delta V2$ represents the channel potential difference between the lower sides of the storage electrodes 112$b$, 112$c$, 112$d$, . . . and the lower side of the barrier electrodes 113$b$, 113$c$, 113$d$, . . . when a different pulse is input.

The charge transfer efficiency increases when the values of both $\Delta V1$ and $\Delta V2$ increase. However, since it is desirable to reduce the voltage in order to reduce the power consumption, both values of the $\Delta V1$ and $\Delta V2$ are reduced to lower values. The $\Delta V3$ is a channel potential difference of the horizontal terminal electrode portion between the lower sides of the storage electrode 112$a$ and the barrier electrodes 113$a$.

If the short channel effect or the narrow channel effect is neglected, the $\Delta V1$ and $\Delta V3$ are determined by the impurity concentration between the n$^-$-type semiconductor regions 126$a$, 126$b$, 126$c$, . . . and an n$^-$-type semiconductor well 121, and it is desirable that the $\Delta V1$ and $\Delta V3$ are the same. However, practically, because of the narrow channel effect by narrowing the channel width as described above, the $\Delta V3$ is lower by 0.1 to 0.3 V below the $\Delta V1$. That is, in the horizontal terminal electrode portion, the electric field between the storage electrode and the barrier electrode, to which the same pulse is applied, becomes weaker than that of the general horizontal transfer electrode portion, so that the transfer efficiency decreases at the terminal electrode portion. Especially when the driving pulse amplitude is reduced to a level of 3.3 V for reducing the power consumption, the $\Delta V1$ is reduced to a level as small as 1.0 V to 1.5 V and the $\Delta V3$ becomes smaller than the $\Delta V1$ value by 0.1 to 0.3 V, which causes the problem that the degradation of the transfer efficiency becomes more remarkable.

A method to prevent the degradation of the transfer efficiency in the vicinity of the horizontal terminal electrode portion is disclosed in Japanese Unexamined Patent Application, First publication No. Hei 9-252106. In this method, the storage electrode and the barrier electrode of the horizontal terminal electrode portion are unified into one electrode and then the storage region and the barrier region are divided by locally changing the impurity concentrations in a layer below the unified electrode. This measure has the effect that the pinning phenomenon of the channel potential by excess impurity injection can be prevented, since it is possible to eliminate, before formation of the horizontal transfer electrode, the channel used for potential adjustment of the entire horizontal CCD register and the process for the ion injection of the opposite conductive type ions. However, even in this method, the same problem still remains as that shown in the above Japanese Unexamined Patent Application, First Publication No. Hei 11-17613, because the process for providing the impurity concentration difference in these regions below the storage electrode and the barrier electrode is the same as the process for forming the horizontal transfer electrode portion and the horizontal terminal electrode portion.

The other method for improving the transfer efficiency in the vicinity of the horizontal terminal electrode portion is disclosed in Japanese Unexamined Patent Application, First Publication No. 5-55539. In this method, the storage electrode and the barrier electrode in the horizontal terminal electrode portion are unified into a first layer of a polycrytalline silicon gate electrode and the output gate electrode is constituted by forming a second polycrystalline silicon layer so that the impurity injection is performed on the lower portion of the output gate electrode in a self-aligning manner with the edge of the first layer of the polycrystalline silicon gate electrode. This method has the effect that the channel potential below the output gate electrode can be independently adjusted by changing the amount of impurity implantation.

However, the above-described method provides two layers consisting of a layer as a channel for the potential adjustment of the entire horizontal CCD register and a layer with the opposite conduction type, and the channel potential difference between the storage terminal region and the barrier terminal region of the horizontal terminal electrode portion is determined by the amount of impurity implantation and the location of the boundary of these two regions. Thus, the problem arises that there are many restrictions in determining the channel potential difference, and, since the impurity injection edge is determined by visual observation, the effective length of the barrier region in the charge transfer direction disperses, which may affect the channel potential difference between the storage region and the barrier region.

SUMMARY OF THE INVENTION

The present invention was made to solve above-described problems and an object of the present invention is to provide charge transfer devices having high charge transfer efficiency, low variation of the quality in the manufacturing process, and also a large freedom in designing the charge transfer devices.

The first aspect of the present invention provides a charge transfer device, which is provided with a plurality of pairs of charge transfer electrodes composed of an output gate electrode and a plurality of storage electrodes and barrier electrodes formed on a first conduction-type semiconductor layer, and a signal charge is transferred by applying a two phase driving pulse to said transfer electrodes, wherein a charge transfer electric field in a channel below a boundary portion between a terminal storage electrode and a terminal barrier electrode, which constitute a pair of charge transfer electrodes located closest to the output electrode, is set higher than a charge transfer electric field in a channel below a boundary portions of pairs of storage electrodes and barrier electrodes, which constitute pairs of storage electrodes and barrier electrodes other than the pair of the terminal electrodes.

In the above charge transfer device, said first conduction-type semiconductor layer corresponds to either one of a first conduction-type well layer formed on a second conduction-type semiconductor substrate or a first conduction-type semiconductor substrate.

In the above charge transfer device, a difference between the charge transfer electric field in a channel below a boundary portion between a terminal storage electrode and a terminal barrier electrode, which constitute a pair of charge transfer electrodes located closest to the output electrode, and the electric field for the charge transfer in a channel below a boundary portions of pairs of storage electrodes and barrier electrodes, which constitute pairs of storage electrodes and barrier electrodes other than the pair of the terminal electrodes, is formed by the difference in the impurity concentrations injected in respective boundary portions.

In the above charge transfer device, the impurity ions in the channel under the terminal storage electrode for forming the difference between the impurity concentrations is injected in a self-aligning manner with the insulating films formed at the side surfaces of the terminal barrier electrode and the output gate electrode.

The present invention includes a solid image pickup apparatus comprising the above-described charge transfer devices.

DETAILED DESCRIPTION OF THE INVENTION

Figure 1:
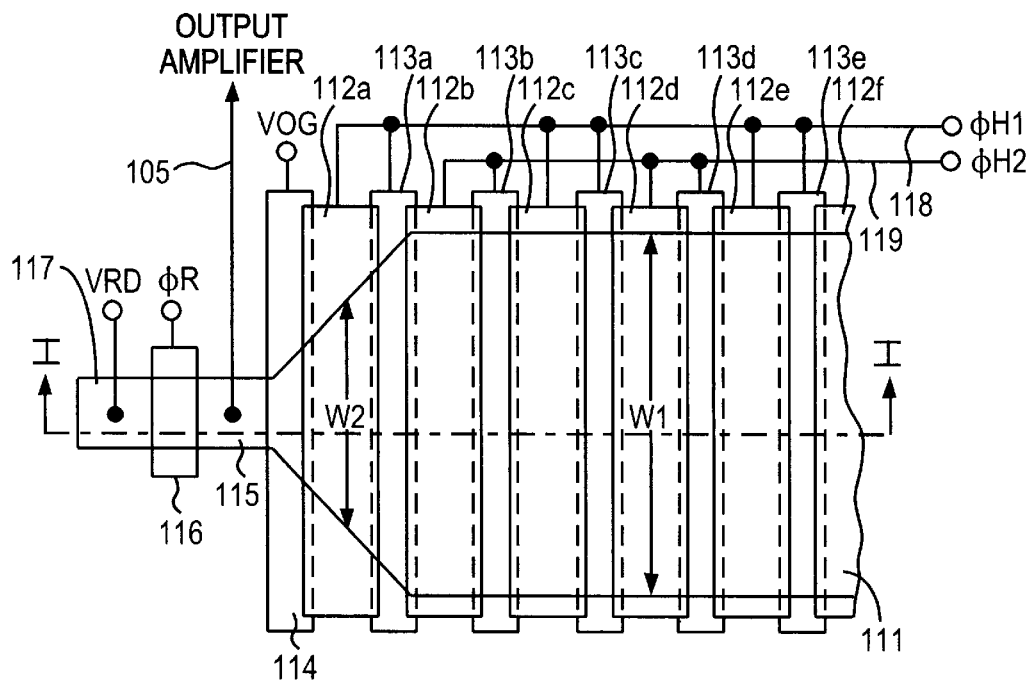
FIG. 1 is a plan view of a charge transfer device according to one embodiment of the present invention.
Figure 2:
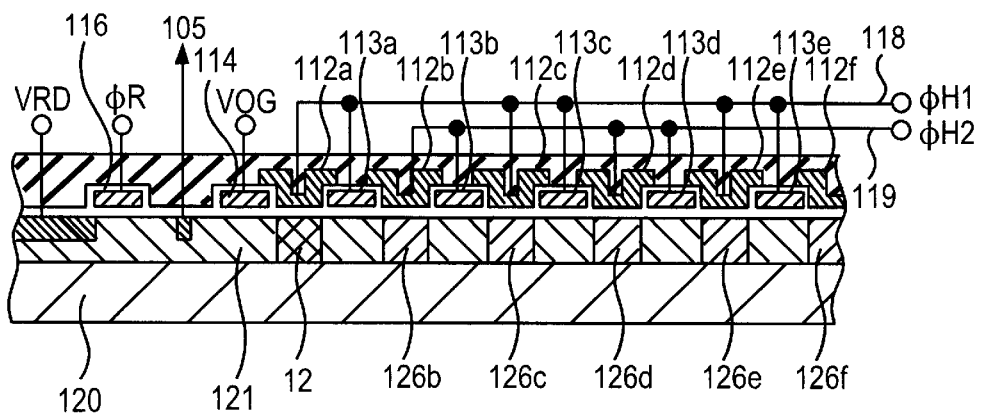
FIG. 2 is a cross-sectional view along the A—A line shown in FIG. 1.
Figure 6:
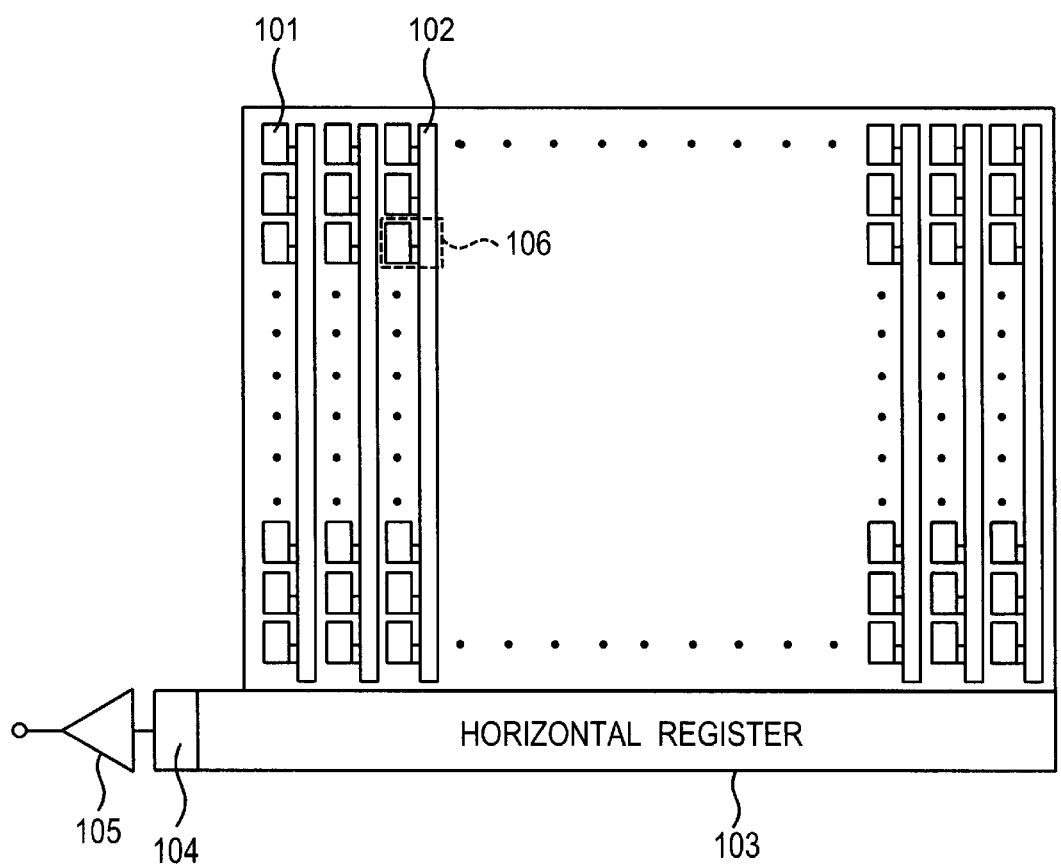
FIG. 6 is a diagram showing the structure of a general interline transfer-type solid image pick up apparatus.

Hereinafter, first and second embodiments of the present invention are described in detail with reference to the attached drawings. FIG. 1 is a plan view of a charge transfer device according to the first embodiment of the present invention. FIG. 2 is a cross-sectional view along the A—A line shown in FIG. 1. Except for one part, FIGS. 1 and 2 are the same as the conventional device shown FIGS. 7 and 8. Accordingly, the same components are denoted by the same reference numerals. The charge transfer device shown in FIGS. 1 and 2 is used, for example, in the horizontal shift register of the interline transfer-type solid image pick-up apparatus shown in FIG. 6. As shown in FIG. 1, a plurality of charge transfer electrodes 112a, 112b, 112c, . . . , and a plurality of barrier electrodes 113a, 113b, 113c, . . . are formed on a charge transfer channel 111. To simplify the explanation, a pair of the charge transfer electrodes composed of the storage electrode 112a and the barrier electrode 113a located at the leftmost side of the figure is called a horizontal terminal electrode and the other pairs of charge transfer electrodes are simply called horizontal charge transfer electrodes.

Adjacent to the horizontal final storage electrode 112a, an output gate electrode 114 is formed. At the terminal of the output electrode 114, a floating diffusion layer 115 is formed which constitutes charge detecting portion 104, and the floating diffusion layer 115 is connected to the output amplifier 105. At one terminal of the floating diffusion layer, a reset gate electrode 116 is formed and at one terminal of the reset gate electrode 116, a reset drain 117 is formed. Furthermore, each adjacent pair of the storage electrodes 112a, 112b, 112c, . . . and the barrier electrodes 113a, 113b, 113c, . . . are alternatively connected to a metal wire 118 and a metal wire 119.

Figure 7:
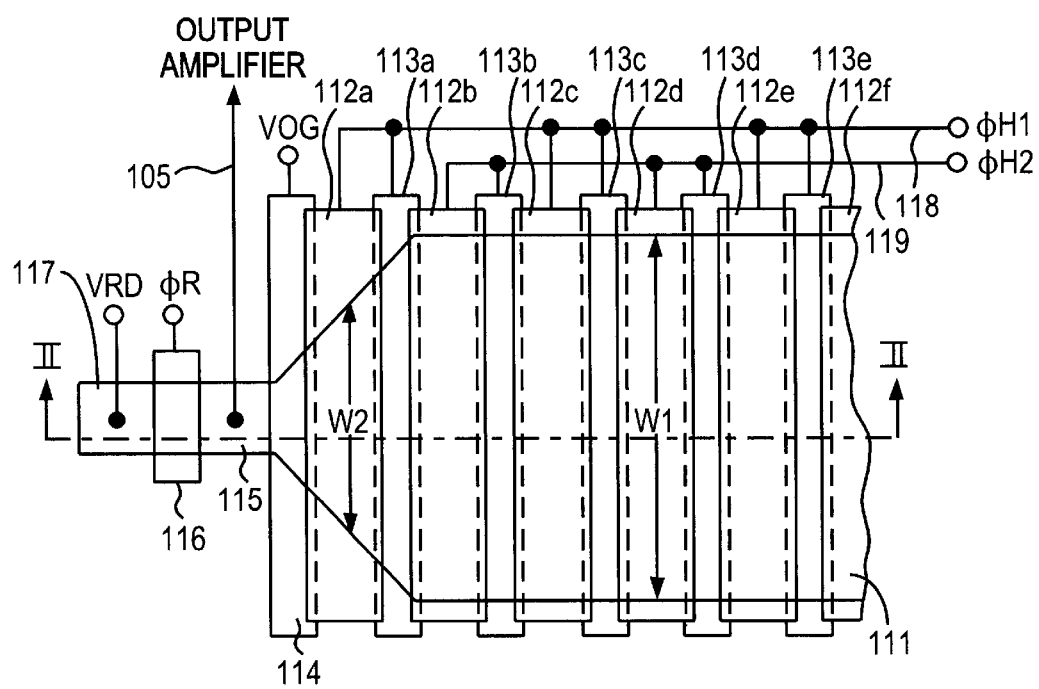
FIG. 7 is a plan view showing the structure of an output portion of a conventional horizontal CCD register.
Figure 8:
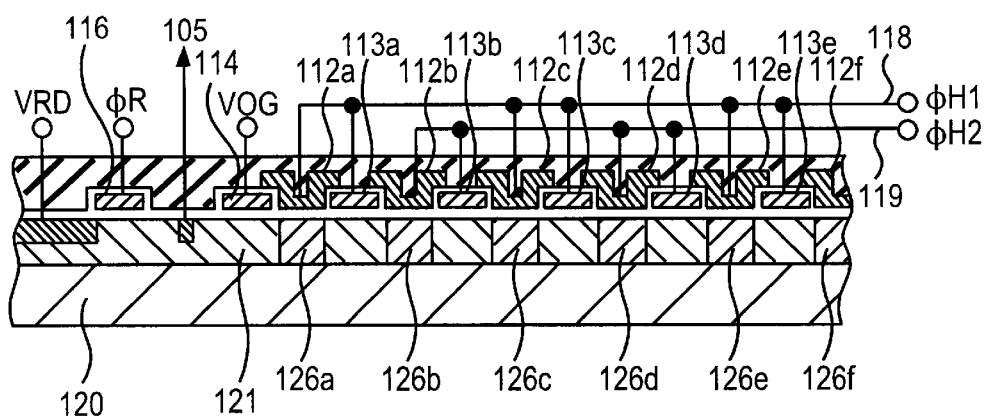
FIG. 8 is a cross-sectional view along the A—A line shown in FIG. 7.
Figure 9A:
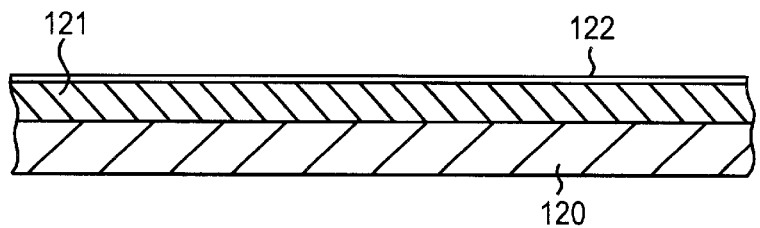
FIGS. 9A to 9F are diagrams explaining a manufacturing method of a conventional charge transfer device.
Figure 9B:
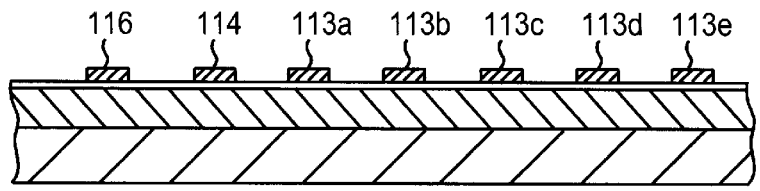
Figure 9C:
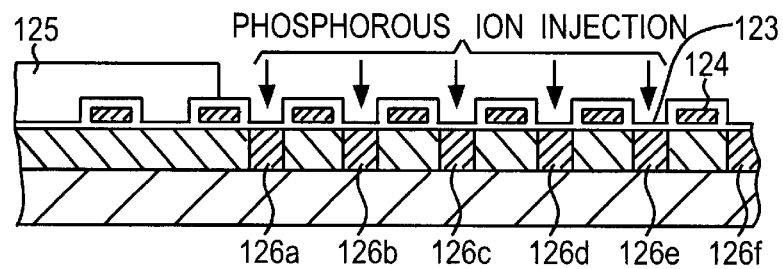
Figure 9D:
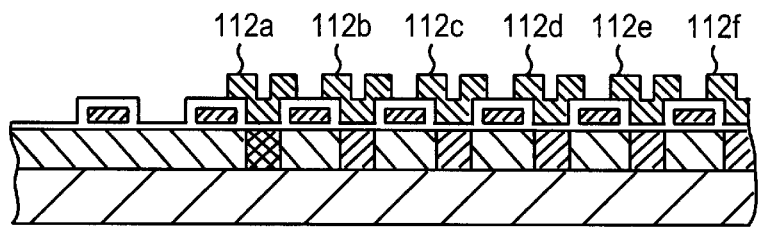
Figure 9E:
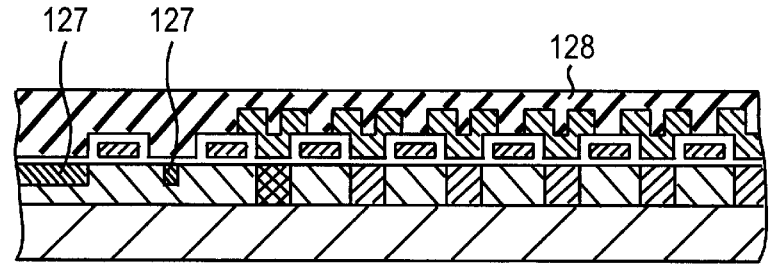
Figure 9F:
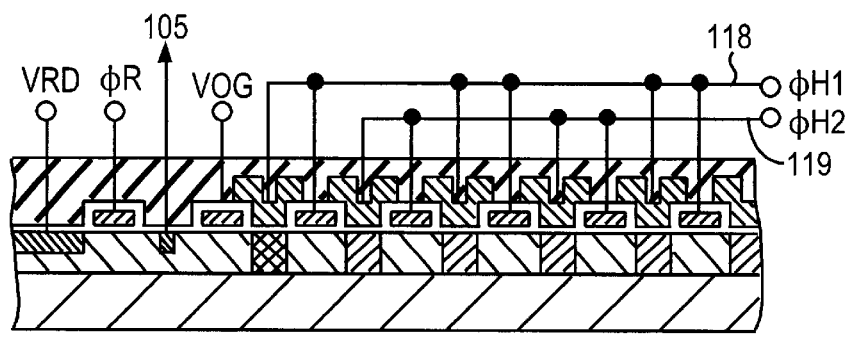
Figure 10:
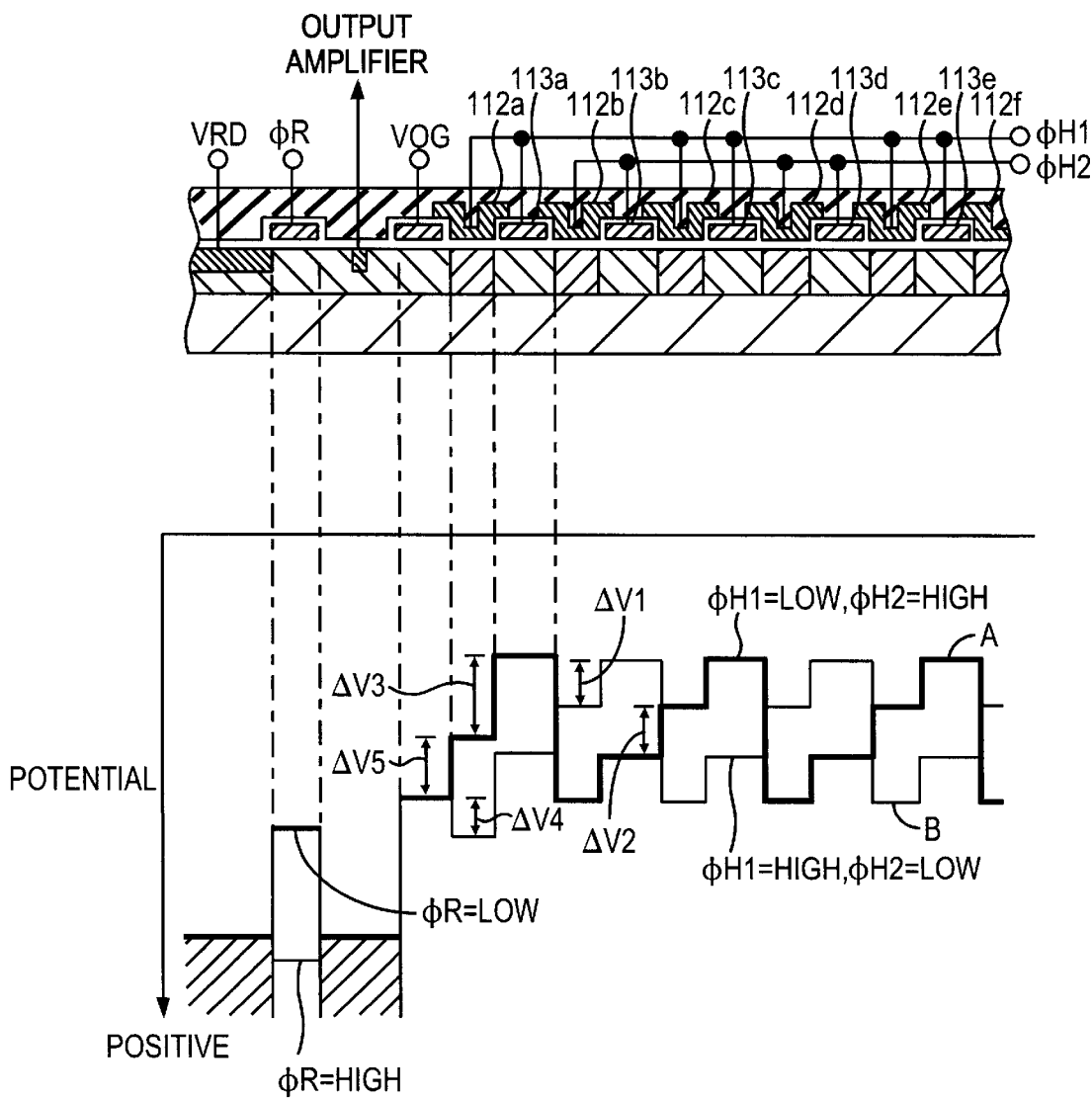
FIG. 10 is a typical representation of the potential distribution in the vicinity of the output portion of the conventional horizontal CCD register.

Two phase driving pulses φH1 and φH2 are respectively input into the metal wires 118 and 119. A dc voltage VOG is input into the output gate 114, a reset pulse φR is input into the reset gate electrode 116, and a dc voltage VRD is input into the reset drain 117. Here, the point that differentiates the present embodiment from the conventional apparatus shown in FIGS. 7 and 8 is that the n⁻-type semiconductor region 12a in FIG. 8 is replaced with an n⁻-type semiconductor region 12 in this embodiment. A detailed description is provided later regarding this point. The other portions of the present embodiments are the same as those in the conventional apparatus.

Figure 3A:
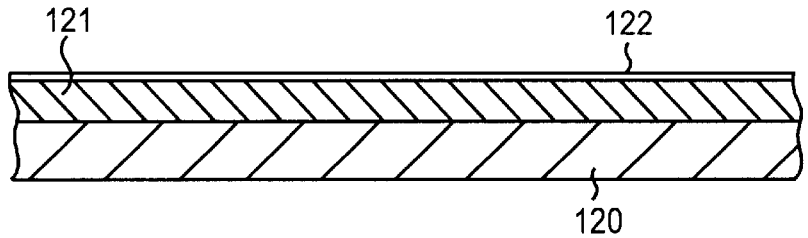
FIGS. 3A to 3G are diagrams explaining a manufacturing method of the charge transfer device according to the first embodiment of the present invention.
Figure 3B:
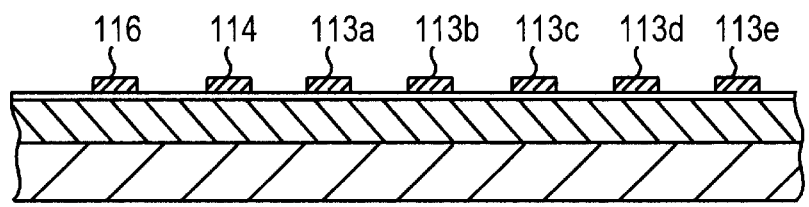

Next, the cross-sectional structure shown in FIG. 2 is described following the manufacturing processes. As shown in FIG. 3A, an n⁻-semiconductor well 121, having a depth of around 0.5 μm and an impurity concentration of $8\times10^{16}$ cm$^{-3}$, is formed on a main surface of a p-type semiconductor substrate 120 having an impurity concentration of around $1\times10^{15}$ cm$^{-3}$ and a first insulating film 122 with a thickness of around 100 nm is formed on a surface of the n⁻-type semiconductor well 121 by an oxidation process such as thermal oxidation. Subsequently, as shown in FIG. 3B, a 30 nm thick first polycrystalline silicon film is formed on the first insulating film 122, and the barrier electrodes 113a, 113b, 113c, . . . the output gate electrode 114, and a reset gate electrode 116 are formed by patterning the first polycrystalline silicon film by photolithography.

Figure 3C:
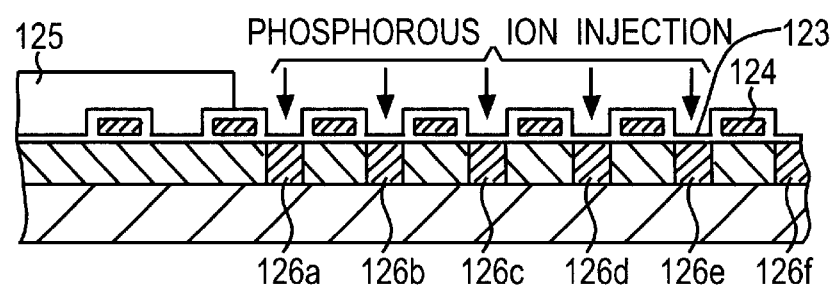

Subsequently, as shown in FIG. 3C, a 100 nm thick second insulating film is formed on the surface of the n⁻-type semiconductor well 121 by, for example, thermal oxidation. Subsequently, a 200 nm thick third insulating film 124 is formed at the side surfaces of the barrier electrodes 113a, 113b, 113c, . . . , the output gate electrode 114 and the reset gate electrode 116 by the accelerating oxidation of the polycrystalline silicon. Subsequently, a resist pattern 125 is formed by coating a resist film and patterning by photolithography, and then, n⁻-type semiconductor regions 126a, 126b, 126C, . . . , are formed by phosphorous ion implantation. Here, the first polycrystalline silicon and the third insulating film serve as the mask.

Figure 3D:
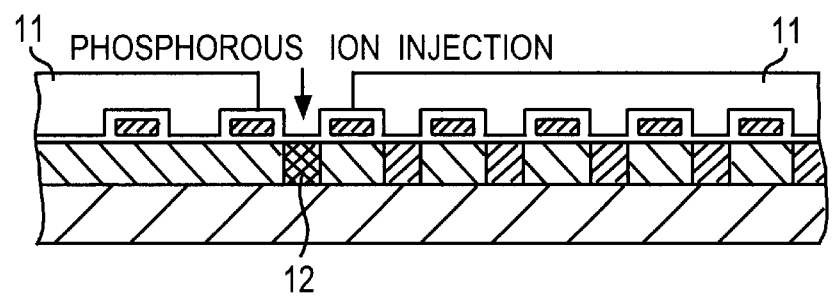
Figure 3E:
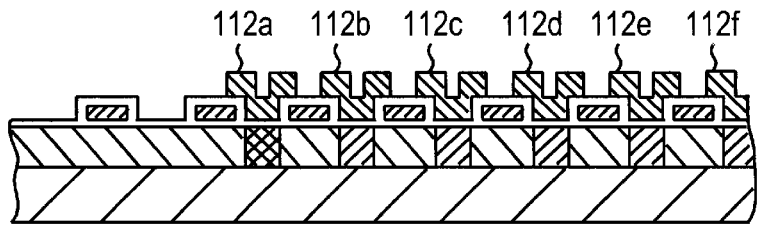

Subsequently, as shown in FIG. 3D, the resist 125 is peeled off, a resist layer is newly coated, the resist pattern 11 is formed by patterning it by photolithography, and an n-type semiconductor region 12 is formed by phosphorous ion implantation. The first polycrystalline silicon film and the third insulating film serve as the mask. Subsequently, as shown in FIG. 3E, a 300 nm thick second polycrystalline film is deposited and storage electrodes 112a, 112b, 112c, . . . are formed by patterning the polycrystalline film by photolithography.

Figure 3F:
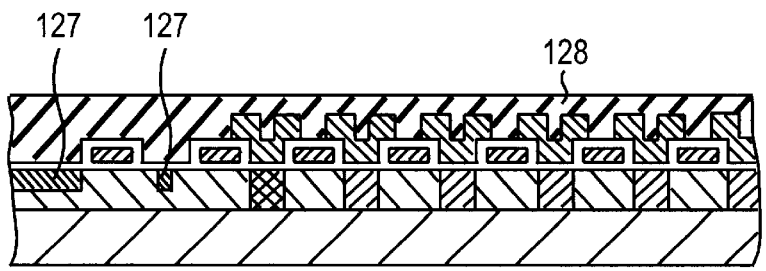
Figure 3G:
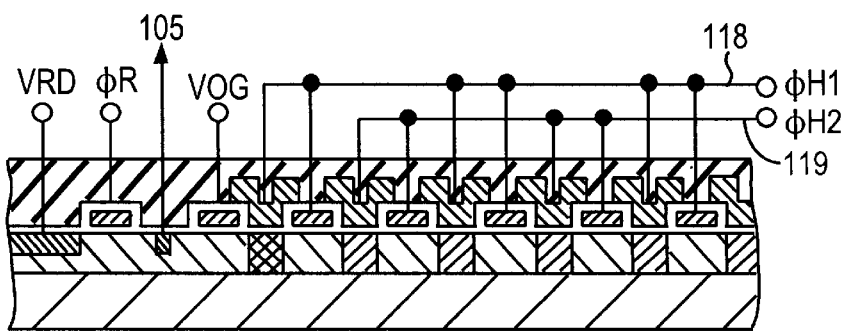

Subsequently, as shown in FIG. 3F, a n⁺-type semiconductor region 127 having a depth of around 0.3 µm and an impurity concentration of $1 \times 10^{20}$ cm$^{-3}$ is formed and an interlayer insulating film 128 is then formed. Subsequently, as shown in FIG. 3G, a through hole (not shown) is provided, and a conductive film such as aluminum film is formed and by patterning the conductive film by photolithography for forming metal wires 118 and 119, which are respectively connected to the first polycrystalline silicon film, the second polycrystalline silicon film, and an n⁺-type semiconductor region 127. According to the above-described processes, the charge transfer device with the structure shown in FIG. 3G is obtained, which is the same as that shown in FIG. 2.

Figure 4:
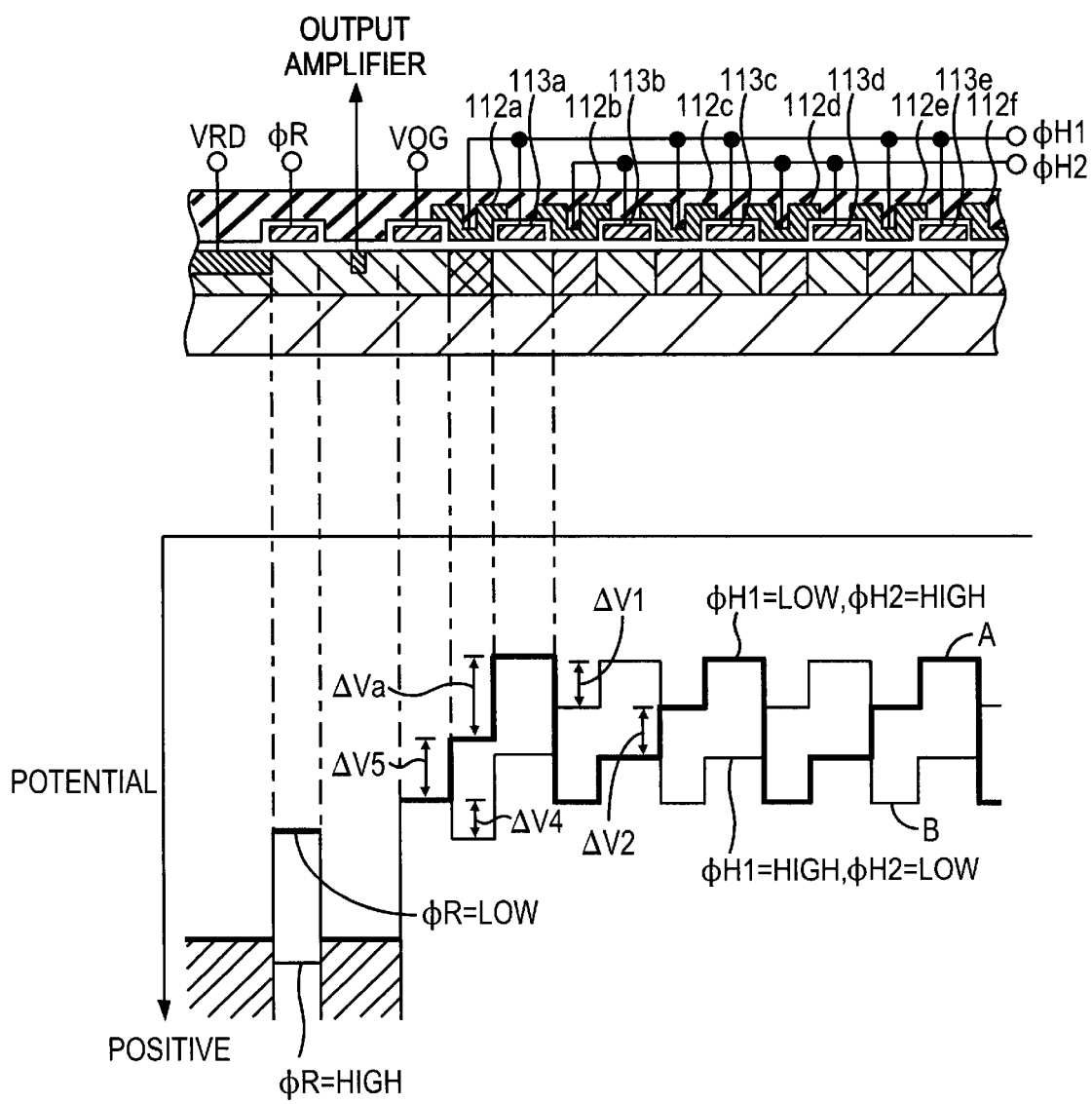
FIG. 4 is a typical representation of the potential distribution in the vicinity of the output portion of the horizontal CCD register of the present invention.

Next, an operation of the charge transfer device according to the present embodiment is described. FIG. 4 is a diagram showing the typical potential distribution adjacent to the output portion of the horizontal CCD register according to the present embodiment. FIG. 4 shows when the horizontal CCD register is driven by two phase driving pulse φH1 and φH2. The signal charge is transferred from the right side to the left side of the figure. The bold solid line A indicated the potential when φH1 is at a low level, φH2 is at a high level, and φR is at a low level, and the signal charge stored at the horizontal terminal electrode portion is transferred to the floating diffusion layer 115 through the output gate electrode 114. In contrast, the thin line B indicates the potential when a driving pulse is being applied, in which φH1 is on a high level, φH2 is on a low level, and φR is on a high level, and the signal charge stored in the floating diffusion layer 115 is discharged to the reset drain 117 through a reset gate electrode 116. At the same time, the signal charge for the next bit stored in the previous stage is transferred to the horizontal terminal electrode portion.

The potential variation of the channel by the horizontal driving pulse is equal to the sum of ΔV1 and ΔV2 shown in FIG. 4. The ΔV1 is the channel potential differences between the lower parts of storage electrodes 112b, 112c, 112d, . . . , and the lower parts of the barrier electrodes 113b, 113c, 113d, . . . , when the same pulse is applied to both electrodes. The ΔV2 is the channel potential difference between the storage electrodes 112b, 112c, 112d, . . . , and the barrier electrodes 113b, 113c, 113d, . . . , when two different pulses φH1 and φH2 are applied to respective electrodes.

A ΔVa is a channel potential difference between the lower part of the storage electrode 112a and the lower part of barrier electrode 113a of the horizontal terminal electrodes portion. The point that the ΔVa is larger than the ΔV1 differs from the conventional device. This is because the impurity concentration of the n-type semiconductor region 12 below the horizontal final storage electrode 112a is made thicker than that of the n⁻-type semiconductor regions 126a below the storage electrodes 112b, 112c, 112c, . . . The ΔV4 is a channel potential difference indicating the potential difference capable of storing the charge in the horizontal terminal electrode portion. The ΔV5 is a channel potential difference between the lower parts of the horizontal terminal storage electrode and the output gate electrode when φH1 is at a low level.

The numeral values of actual potentials will be described below. When the driving pulse has an amplitude of 3.3 V, the variation of the channel potential is within a range of 2 to 3 V. When the lengths of the storage electrode and the barrier electrodes in the transfer direction are the same, the ΔV1 is designed so as to be the same value as ΔV2. That is, each of their values becomes 1 to 1.5 V. It is noted that the signal change can be stored up to the ΔV1. The value of VOG is determined such that the following three conditions can be fulfilled, that is, (1) to be able to secure a sufficient field strength so as to transfer the charge from the lower part of the horizontal terminal storage electrode 112a to the floating diffusion layer 115 through the output gate electrode 114, (2) to be able to store a sufficient amount of charge under the horizontal terminal storage electrode 112a, and (3) to be able to suppress that the charge stored in the floating diffusion layer 112a returning to the lower side of the horizontal terminal storage electrode 112a. The channel potential at the lower part of the output gate electrode 114 is 7 to 10 V. The potential of the reset drain 117 is around 15 V. When the reset pulse is on a high level, the potential of the reset drain is reset to 15 V.

The upper limit in the adjustment range of the VOG is a channel potential below the reset gate 116, when the reset pulse φR is on a low level. When the amplitude of the reset pulse is assumed to be 3.3 V, the channel potential below the reset gate electrode is at a level of 12 V. As described above, since the channel potential below the output gate electrode 116 of the conventional output gate electrode 114 is about 7 to 10 V, it is possible to further raise the potential by 2 V, while fulfilling the above-described three conditions required for the VOG. Thereby, it is possible to increase the ΔVa while maintaining the ΔV4 and ΔV5 at the conventional values.

That is, since the ΔVa can be increased by at least 2 to 3 V in comparison with the ΔV1 which is 1 V to 1.5 V, the transfer field between the horizontal terminal storage electrode and the horizontal terminal barrier electrode is made twice that of the conventional field. Accordingly, even if the channel width is made narrower, the reduction of the transfer efficiency can be suppressed. As shown in FIG. 3D, in order to increase the ΔVa, the ion injection is performed into the third insulating film formed by the accelerating oxidization of an electrode composed of the first polycrystalline silicon film in a self-aligning manner, and the manufacturing dispersion of the products can be suppressed. Furthermore, since the present invention provides a margin of about 2 V in the upper limit of the adjustable range of the VOG, a higher freedom is obtained in designing ΔVa.

FIG. 5 is a diagram explaining the manufacturing method of a charge transfer device according to the second embodiment of the present invention. The structure of the charge transfer device according to the second embodiment is basically the same as that shown in FIG. 3, and only the point of difference between this embodiment and the first embodiment is described below. The manufacturing method shown in FIGS. 5A and 5B are the same as those shown in FIG. 3. Subsequently, as shown in FIG. 5C, a second insulating film 123 with a thickness of around 200 nm is formed on the surface of the n⁻-type semiconductor well 121 by, for example, thermal oxidization. Furthermore, a 200 nm thick third insulating film 124 is formed on the side surfaces of the barrier electrodes 113a, 113b, 113c, . . . , the output gate electrode 114, and the reset gate electrode 116 by accelerated oxidization of the polycrystalline silicon.

Figure 5A:
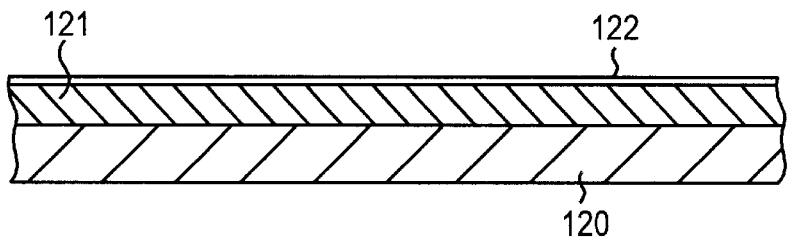
FIGS. 5A to 5G are diagrams explaining a manufacturing method of the charge transfer device according to the second embodiment of the present invention.
Figure 5B:
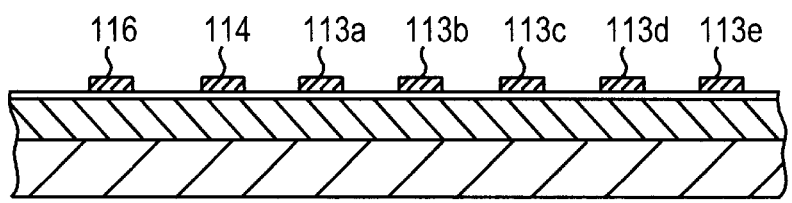
Figure 5C:
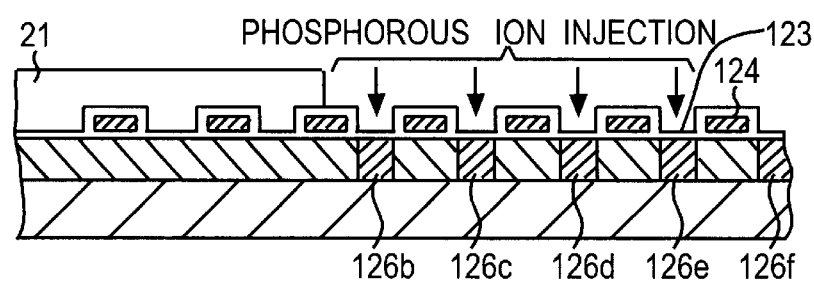
Figure 5D:
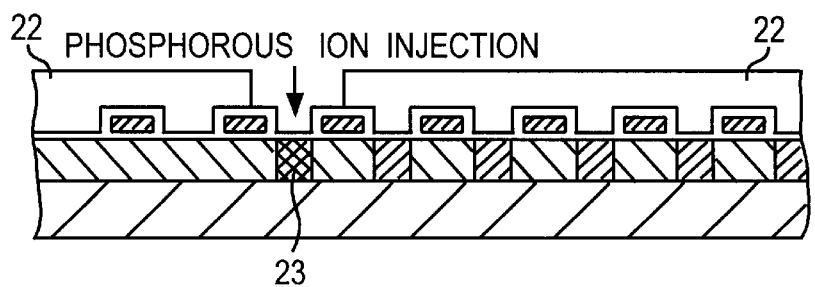
Figure 5E:
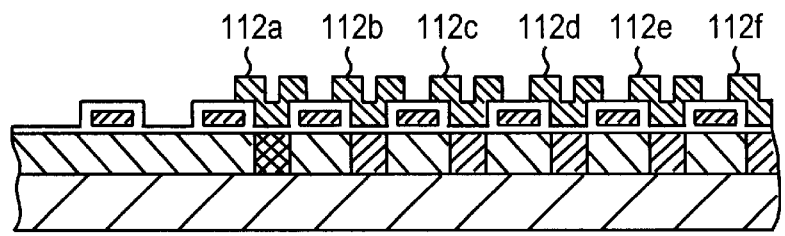
Figure 5F:
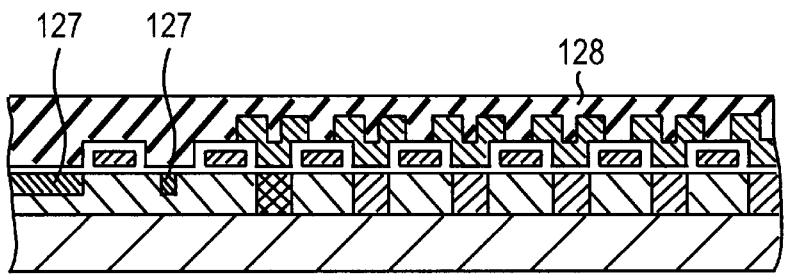
Figure 5G:
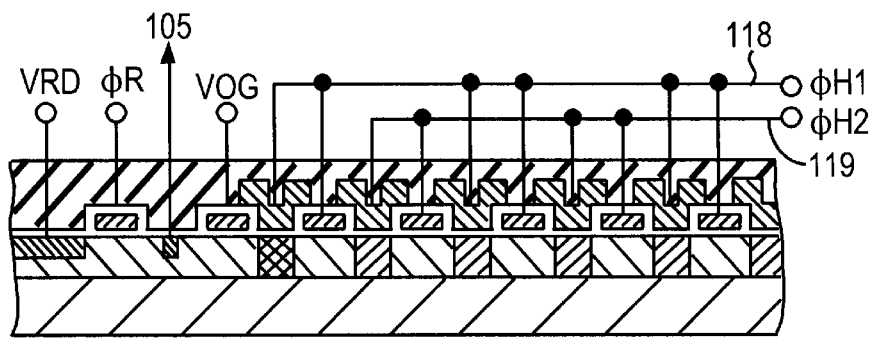

Subsequently, a resist is coated, the resist coat is patterned by photolithography for forming a resist pattern 21, and n⁻-type semiconductor regions 126b, 126c, . . . are formed by phosphorous ion injection. It is noted that the first polycrystalline silicon and the third insulating film 124 serve as the mask. Subsequently, as shown in FIG. 5D, the resist pattern 21 is peeled off, a new resist is coated for forming a resist pattern 22 by patterning by photolithography, and an n-type semiconductor region 23 is formed by the phosphorous ion injection. Here, the first polycrystalline silicon film and the third insulating film serve as the mask. Thereafter, a charge transfer device is obtained through the manufacturing processes shown in FIGS. 5E to 5G.

Now, with regard to forming an n-type semiconductor region 23 below the storage electrode 112a, an impurity is introduced by a one-time ion injection in the present second embodiment shown in FIG. 5, in contrast to the first embodiment shown in FIG. 3 wherein the impurity is introduced twice by ion injection. In either case, if the impurity injection condition is set so as to yield the same impurity concentration difference between that in the n-type semiconductor region 12 and 23 and that in the n⁻-type semiconductor region 126b, 126c, 126d, . . . , the same effects are obtained.

It is noted that in either case shown in FIGS. 1 and 2, semiconductor regions are formed in the p-type semiconductor substrate 120, but it is a matter of course that the present invention can be used in the p-type semiconductor well. In addition, although the driving pulse φH1 is commonly applied to the horizontal terminal electrode portion and the horizontal transfer electrode portion, it is naturally understood that the present invention exhibits the same effect even if the indepterminalent pulses are applied individually to each of the horizontal terminal electrode portion and the horizontal transfer electrode portion. Furthermore, although an explanation is provided in the above first and second embodiments for an example using an interline transfer-type solid image pickup apparatus, the present invention is applicable to any of the charge transfer devices composed of two phase pulse driven CCD registers.

As described above, according to the present embodiment, since the electric potential below the boundary portion between the terminal storage electrode and the terminal barrier electrode is set higher than the other boundary portions between the other general storage electrodes and the other general barrier electrodes, degradation of the transfer efficiency can be prevented even if the channel width is made narrower towards the charge detecting portion.

The impurity ion for increasing the electric field for transferring the charge can be injected in the self-aligning manner with the third insulating film formed by oxidation of the electrode made of the first polycrystalline silicon film, so that the irregularities in the products that occur during the manufacturing process can be eliminated. The present invention further includes an effect that the design freedom can be increased because there is a margin in the upper limit in the adjustable range of VOG.

What is claimed is:

1. A charge transfer device, which is provided with a plurality of pairs of charge transfer electrodes composed of an output gate electrode and a plurality of storage electrodes and barrier electrodes formed on a first conduction-type semiconductor layer, and a signal charge is transferred by applying a two phase driving pulse to said transfer electrodes, wherein a charge transfer electric field in a channel below a boundary portion between a terminal storage electrode and a terminal barrier electrode, which constitute a pair of charge transfer electrodes located closest to the output electrode, is set higher than a charge transfer electric field in a channel below a boundary portions of pairs of storage electrodes and barrier electrodes, which constitute pairs of storage electrodes and barrier electrodes other than the pair of the terminal electrodes.

2. A charge transfer device according to claim 1, wherein said first conduction-type semiconductor layer corresponds to either one of a first conduction-type well layer formed on a second conduction-type semiconductor substrate or a first conduction-type semiconductor substrate.

3. A charge transfer device according to claim 1, wherein a difference between the charge transfer electric field in a channel below a boundary portion between a terminal storage electrode and a terminal barrier electrode, which constitute a pair of charge transfer electrodes located closest to the output electrode, and the charge transfer electric field in a channel below a boundary portions of pairs of storage electrodes and barrier electrodes, which constitute pairs of storage electrodes and barrier electrodes other than the pair of the terminal electrodes, is formed by the difference in the impurity concentrations injected in respective boundary portions.

4. A charge transfer device according to claim 3, wherein the impurity ions in the channel under the terminal storage electrode for forming the difference between the impurity concentrations is injected in a self-aligning manner with the insulating films formed at the side surfaces of the terminal barrier electrode and the output gate electrode.

5. A solid image pickup apparatus comprising charge transfer devices which are provided with a plurality of pairs of charge transfer electrodes composed of an output gate electrode and a plurality of storage electrodes and barrier electrodes formed on a first conduction-type semiconductor layer, and a signal charge is transferred by applying a two phase driving pulse to said transfer electrodes, wherein a charge transfer electric field in a channel below a boundary portion between a terminal storage electrode and a terminal barrier electrode, which constitute a pair of charge transfer electrodes located closest to the output electrode, is set higher than a charge transfer electric field in a channel below a boundary portion of pairs of storage electrodes and barrier electrodes, which constitute pairs of storage electrodes and barrier electrodes other than the pair of the terminal electrodes.

6. A solid image pickup apparatus according to claim 5, wherein said first conduction-type semiconductor layer corresponds to either one of a first conduction-type well layer formed on a second conduction-type semiconductor substrate or a first conduction-type semiconductor substrate.

7. A solid image pickup apparatus according to claim 5, wherein a difference between the charge transfer electric field in a channel below a boundary portion between a terminal storage electrode and a terminal barrier electrode, which constitute a pair of charge transfer electrodes located closest to the output electrode, and the charge transfer electric field in a channel below a boundary portion of pairs of storage electrodes and barrier electrodes, which constitute pairs of storage electrodes and barrier electrodes other than the pair of the terminal electrodes, is formed by the difference in the impurity concentrations injected in respective boundary portions.

8. A solid image pickup apparatus according to claim 7, wherein the impurity ions in the channel under the terminal storage electrode for forming the difference between the impurity concentrations is injected in a self-aligning manner with the insulating films formed at the side surfaces of the terminal barrier electrode and the output gate electrode.

* * * * *